(12) United States Patent
Kim et al.

(10) Patent No.: US 12,199,587 B2
(45) Date of Patent: Jan. 14, 2025

(54) SURFACE ACOUSTIC WAVE DEVICE AND MANUFACTURING METHOD THEREOF

(71) Applicant: WISOL CO., LTD., Gyeonggi-do (KR)

(72) Inventors: Tae Hyun Kim, Gyeonggi-do (KR); Chul Hwa Lee, Gyeonggi-do (KR); Hun Yong Lee, Gyeonggi-do (KR); Kihara Yoshikazu, Gyeonggi-do (KR)

(73) Assignee: WISOL CO., LTD., Gyeonggi-do (KR)

(*) Notice: Subject to any disclaimer, the term of this patent is extended or adjusted under 35 U.S.C. 154(b) by 843 days.

(21) Appl. No.: 17/140,249

(22) Filed: Jan. 4, 2021

(65) Prior Publication Data

US 2021/0211114 A1 Jul. 8, 2021

(30) Foreign Application Priority Data

Jan. 3, 2020 (KR) .................. 10-2020-0000886

(51) Int. Cl.
*H03H 9/02* (2006.01)
*H03H 3/08* (2006.01)

(52) U.S. Cl.
CPC .......... *H03H 9/02574* (2013.01); *H03H 3/08* (2013.01); *H03H 9/02566* (2013.01)

(58) Field of Classification Search
CPC ........... H03H 9/02574; H03H 9/02566; H03H 9/02622; H03H 9/02614; H03H 9/14538; H03H 3/08
See application file for complete search history.

(56) References Cited

U.S. PATENT DOCUMENTS

| | | | |
|---|---|---|---|
| 8,689,426 B2* | 4/2014 | Thalmayr | H10N 30/04 701/472 |
| 9,553,013 B2* | 1/2017 | Stuber | H01L 21/84 |
| 11,626,857 B2* | 4/2023 | Nozoe | H03H 9/14544 310/313 B |
| 2003/0199105 A1* | 10/2003 | Kub | H01L 21/76254 438/48 |
| 2004/0173816 A1* | 9/2004 | Saxler | H03H 3/08 257/195 |
| 2005/0174200 A1* | 8/2005 | Lee | H03H 9/02937 29/25.35 |
| 2008/0169474 A1* | 7/2008 | Sheppard | H03H 3/08 257/E27.014 |

(Continued)

FOREIGN PATENT DOCUMENTS

FR 2714200 A1 * 6/1995 ............... H03H 3/08
JP 2020043403 A * 3/2020

(Continued)

*Primary Examiner* — Jeffrey T Carley
(74) *Attorney, Agent, or Firm* — Harness, Dickey & Pierce, P.L.C.

(57) ABSTRACT

A surface acoustic wave (SAW) device according to the present invention includes: a substrate; an intermediate layer formed on an upper surface of the substrate; a piezoelectric layer formed on an upper surface of the intermediate layer; and an inter-digital transducer (IDT) electrode formed on an upper surface of the piezoelectric layer to generate a SAW, wherein an upper portion of the substrate is deformed by a predetermined thickness by ion implantation to form an ion trap layer and the intermediate layer is formed on an upper surface of the ion trap layer.

8 Claims, 6 Drawing Sheets (56) References Cited

U.S. PATENT DOCUMENTS

| | | | | |
|---|---|---|---|---|
| 2011/0278993 | A1* | 11/2011 | Iwamoto | H10N 30/06 |
| | | | | 29/25.35 |
| 2013/0147061 | A1* | 6/2013 | Arriagada | H01L 21/302 |
| | | | | 257/774 |
| 2017/0033764 | A1* | 2/2017 | Inoue | H03H 9/02834 |
| 2017/0063332 | A1* | 3/2017 | Gilbert | H03H 9/02574 |
| 2018/0159495 | A1* | 6/2018 | Inoue | H03H 9/02866 |
| 2020/0204146 | A1* | 6/2020 | Watanabe | H10N 30/85 |
| 2020/0389146 | A1* | 12/2020 | Li | H03H 9/02015 |

FOREIGN PATENT DOCUMENTS

| | | | | |
|---|---|---|---|---|
| KR | 10-2006-0132991 A | | 12/2006 | |
| KR | 10-2013-0086378 A | | 8/2013 | |
| KR | 102410318 B1 | * | 6/2022 | |
| WO | WO-2009081651 A1 | * | 7/2009 | ....... H01L 21/76254 |
| WO | WO-2012043615 A1 | * | 4/2012 | ........... H01L 41/312 |
| WO | WO-2013018604 A1 | * | 2/2013 | ......... H01L 41/0477 |
| WO | WO-2020201222 A1 | * | 10/2020 | ........ H03H 9/02559 |

* cited by examiner

SURFACE ACOUSTIC WAVE DEVICE AND MANUFACTURING METHOD THEREOF

CROSS-REFERENCE TO RELATED APPLICATION

This application claims the benefit under 35 USC § 119(a) of Korean Patent Application No. 10-2020-0000886, filed on Jan. 3, 2020, in the Korean Intellectual Property Office, the entire disclosure of which is incorporated herein by reference for all purposes.

FIELD

The following description relates to a surface acoustic wave (SAW) device and a manufacturing method thereof.

BACKGROUND

As communication technology has advanced remarkably in recent years, miniaturization, high performance, and multi-functionality are required for mobile communication products. In order to satisfy theses requirements, various components, for example, a filter, a duplexer, and the like, used for the mobile communication products are also required to be miniaturized and provide multi-functionality.

As an example of such components, a surface acoustic wave (SAW) device may include a piezoelectric substrate which is a piezoelectric single crystal bare chip, a pair of inter-digital transducer (IDT) electrodes facing each other in an interdigitated pattern on the piezoelectric substrate, and input and output electrodes connected to the IDT electrodes.

In the SAW device, when an electrical signal is applied through the input electrode, the piezoelectric effect causes piezoelectric distortion to occur corresponding to an overlap length between the IDT electrodes, and the piezoelectric distortion generates surface acoustic waves, which are transmitted to the piezoelectric substrate. Then, the surface acoustic waves are converted into an electric signal, and output through the output electrode.

Such a SAW device provides a small size, facilitates processing signals, has a simplified circuit, and can be manufactured in mass production in use of semiconductor processes. Further, the SAW device provides a high side rejection in a passband, allowing it to transmit and receive high-quality information.

However, due to mechanical characteristics of the SAW device, surface acoustic wave energy is dissipated. That is, the SAW device has a problem in that the quality factor decreases due to the loss of surface acoustic wave energy through the substrate.

PRIOR ART DOCUMENTS

Patent Documents (Patent Document 1) Korean Laid-Open Patent Publication No. 10-2006-0132991 (published on Dec. 22, 2006)
(Patent Document 2) Korean Laid-Open Patent Publication No. 10-2013-0086378 (published on Aug. 1, 2013)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

An object of the present invention is to provide a surface acoustic wave (SAW) device and a manufacturing method thereof which allows for formation of an ion trap layer by an ion implantation on a substrate constituting the SAW device.

In one general aspect, a surface acoustic wave (SAW) device includes: a substrate; an intermediate layer formed on an upper surface of the substrate; a piezoelectric layer formed on an upper surface of the intermediate layer; and an inter-digital transducer (IDT) electrode formed on an upper surface of the piezoelectric layer to generate a SAW, wherein an upper portion of the substrate is deformed by a predetermined thickness by ion implantation to form an ion trap layer and the intermediate layer is formed on an upper surface of the ion trap layer.

The substrate may be made of any one of a silicon material, a sapphire material, and a diamond material. The ion trap layer may have the predetermined thickness of from 0.05 μm to 1.0 μm.

The ion trap layer may be formed through at least two or more ion implantation processes by varying at least one of factors including energy, amount of ions, and time.

In another general aspect, a method of manufacturing a SAW device includes: forming a substrate; performing an ion implantation process on an upper portion of the substrate to form an ion trap layer in which the upper portion of the substrate is deformed by a predetermined thickness; forming an intermediate layer on an upper surface of the ion trap layer; forming a piezoelectric layer on an upper surface of the intermediate layer; and forming an IDT electrode on an upper surface of the piezoelectric layer to generate a SAW.

The ion implantation process may be performed at least two or more times to form the ion trap layer by varying at least one of factors including energy, amount of ions, and time.

The ion trap layer may have the predetermined thickness of from 0.05 μm to 1.0 μm.

Other features and aspects will be apparent from the following detailed description, the drawings, and the claims.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

Figure 1:
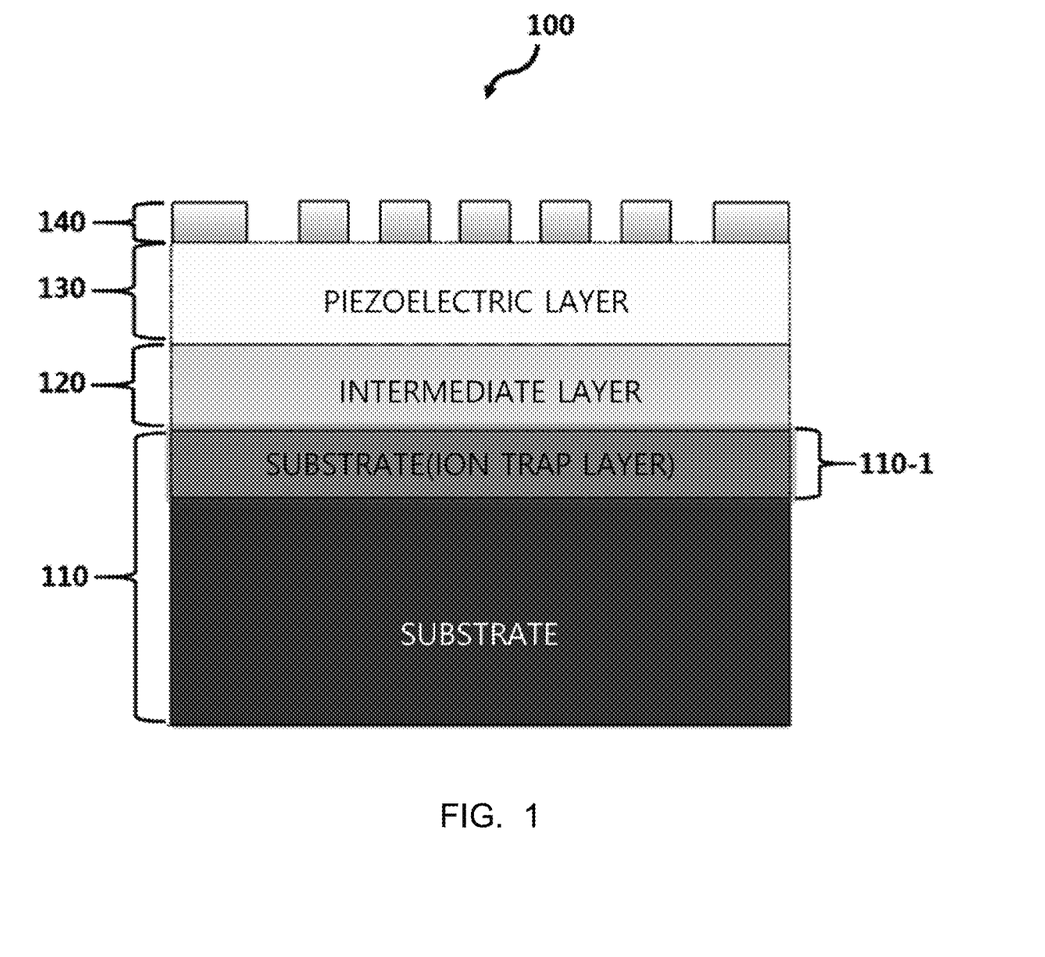
FIG. 1 is a reference diagram illustrating a structure of a surface acoustic wave (SAW) device according to an embodiment of the present invention.

FIG. 1 is a reference diagram illustrating a structure of a surface acoustic wave (SAW) device 100 according to an embodiment of the present invention.

Referring to FIG. 1, the SAW device 100 includes a substrate 110, an intermediate layer 120, a piezoelectric layer 130, and an inter-digital transducer (IDT) electrode 140.

The substrate 110 may be made of any one of a silicon (Si) material, a sapphire material, and a diamond material. A surface orientation of the substrate 110 is not particularly limited, and may be any of, for example, <111>, <100>, and <110>, or these surface orientations may exist in a mixed manner. The thickness of the substrate 110 may be 5 [μm] or more, or twice or more of the wavelength, in consideration of vibration of SAW.

An upper portion of the substrate 110 is deformed by a predetermined thickness by an ion implant so that an ion trap layer is formed, and the intermediate layer 120 is formed on an upper surface of the ion trap layer 110-1. The ion trap layer 110-1 may refer to a substrate in which the substrate 110 made of crystalline silicon (Si) material, sapphire material, or diamond material is amorphized.

Figure 2:
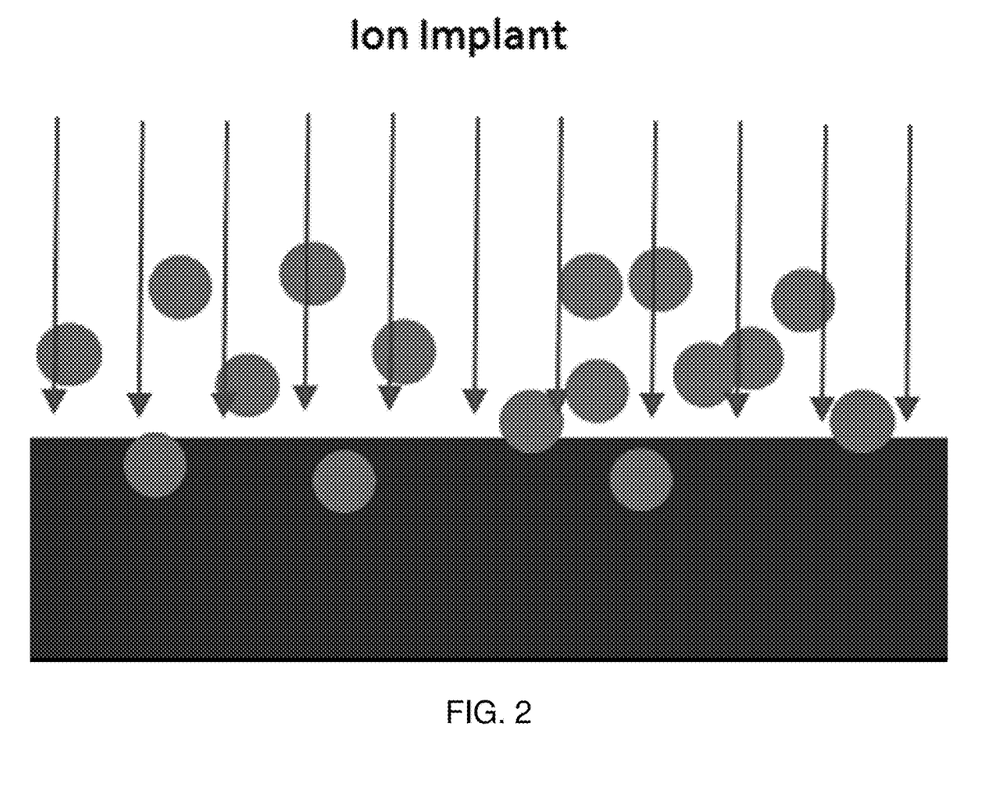
FIG. 2 is a reference diagram illustrating an ion implantation state for forming an ion trap layer on an upper portion of a substrate.

FIG. 2 is a reference diagram illustrating an ion implantation state for forming the ion trap layer 110-1 on the upper portion of the substrate 110.

When an ion implant is performed with the same energy, the smaller the size of the ions, the deeper the ions can travel into the substrate 110, but since the size of the ions are small, a large amount of ions should be implanted. Conversely, when the size of ions is large, relatively large energy is required to implant the ions, but due to the large ion size, the same ion implantation function can be achieved with fewer ions as compared to using the ions of small size.

Figure 3:
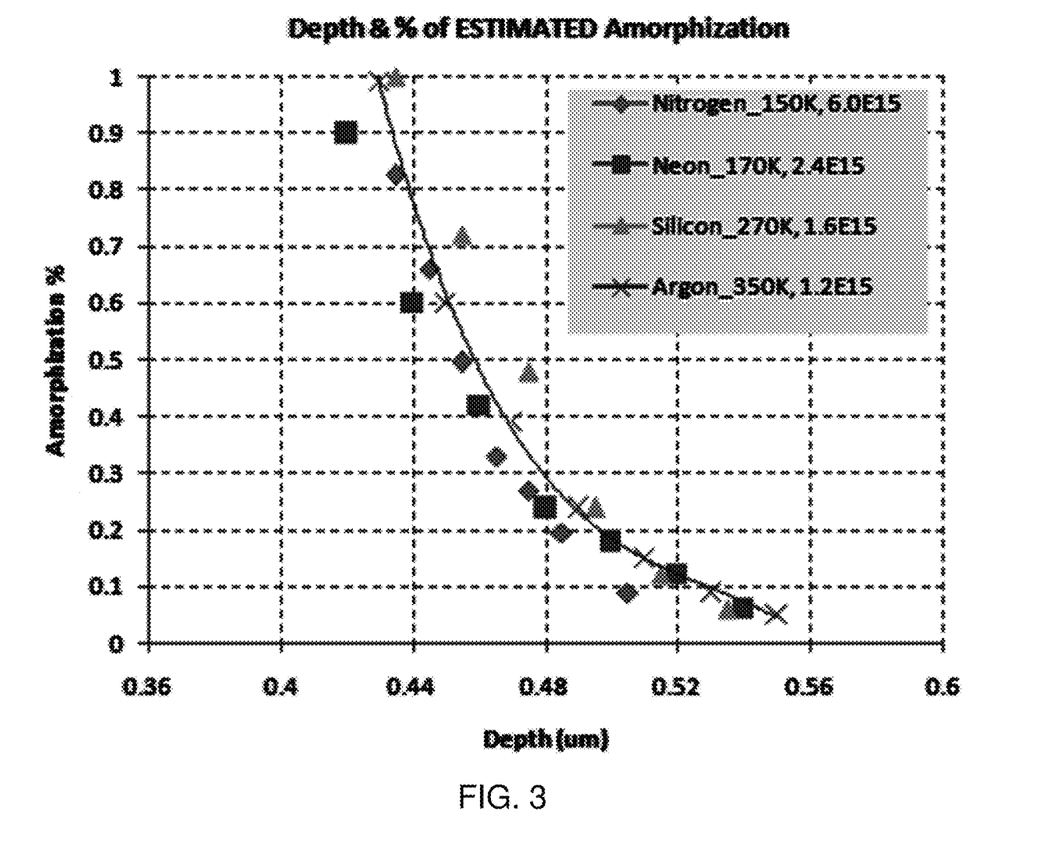
FIG. 3 is a graph showing a degree of amorphization of a substrate according to depth when various types of ions are implanted onto the substrate.

FIG. 3 is a graph showing the degree of amorphization of the substrate 110 according to the depth when various types of ions are implanted onto the substrate 110.

Ion implantation is a process by which various ions are implanted into the substrate 110 by being accelerated with an electric field so that the ions can have a large energy enough to penetrate the surface of the substrate 110. Examples of types of ions to be implanted may include argon ions, silicon ions, neon ions, or nitrogen ions.

It is confirmed that the most similar results of ion implantation (e.g., constant thickness or the like) are achieved when an energy of 350 keV is applied for argon ions, an energy of 270 KeV is applied for silicon ions, an energy of 170 KeV is applied for neon ions, and an energy of 150 KeV is applied for nitrogen ions. The amount of energy to be applied may increase as the size of ions increases, and the amount of energy to be applied may decrease as the size of ions decreases. At this time, in terms of the depth of the ion trap layer 110-1 formed in the substrate 110, nitrogen ions, which are light elements, are most advantages due to the sharpest ion gradient, but the dose density tends to be lowered near the surface.

Due to the formation of the ion trap layer 110-1 on the substrate 110 made of the silicon material, sapphire material, or diamond material, the silicon material, sapphire material, or diamond material is amorphized, and the amorphized substrate 110 may function as a trap layer to prevent leakage of SAW energy toward the substrate. In order to function as a trap layer for preventing energy leakage, the ion trap layer 110-1 formed on the substrate 110 may have a thickness of from 0.4 μm to 0.6 μm.

Figure 4:
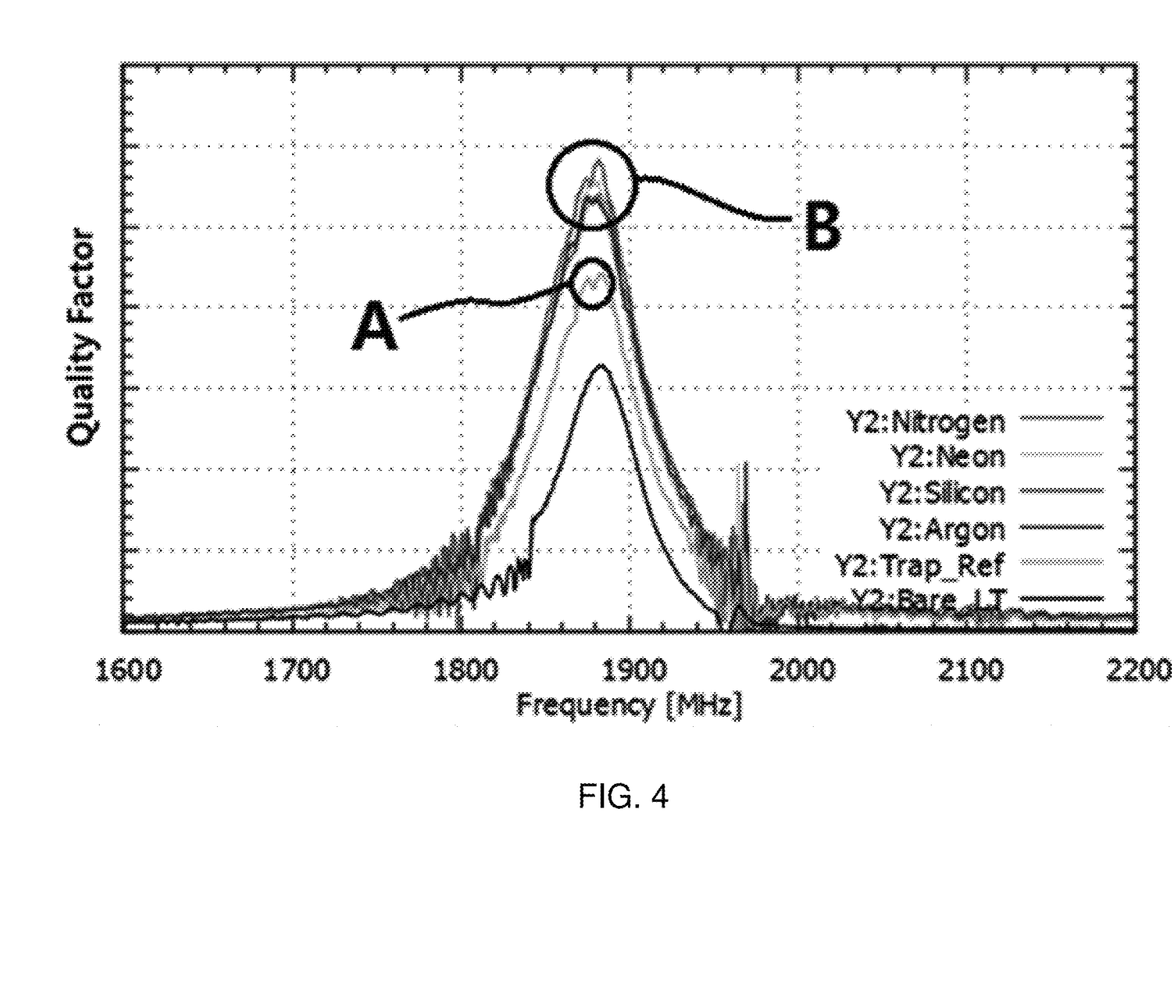
FIG. 4 is a graph showing the magnitude of the Bode quality factor according to formation of ion implantation compared to the conventional one.

FIG. 4 is a graph showing the magnitude of the Bode quality factor according to formation of ion implantation compared to the conventional one.

Referring to FIG. 4, it can be seen that, as compared to a case A in which an existing amorphous trap layer is separately formed between the substrate 110 and the intermediate layer 120, a case B in which an ion implantation is formed in the substrate 110 provide an equal or higher Bode quality value of the SAW device. Therefore, it can be confirmed that the ion implantation process is effective in terms of difficulty in manufacturing process, manufacturing time, or cost since less time and lower difficulty in manufacturing are required as compared to the process of separately forming the amorphous trap layer while the SAW device having the substrate 110 formed by the ion implantation process still has the equivalent quality factor to that of the existing amorphous trap layer.

The intermediate layer 120 is a layer formed on the upper surface of the substrate 110. The intermediate layer 120 has the function of controlling the crystalline characteristics of the piezoelectric layer 130 positioned thereon, and may be made of $SiO_2$ material, AlN material, or the like.

The thickness of the intermediate layer 120 may be appropriately selected according to the type, size, purpose of use, and the like of the underlying substrate 110, and may be preferably in a range between 5 and 500 nm. The reason is that if the intermediate layer 120 is thinner than the lower limit of the above range, the function of controlling the crystalline characteristics of the piezoelectric layer 130 tends to be insufficient, and if the intermediate layer 120 is thicker than the upper limit of the above range, the electromechanical coupling coefficient k2 becomes small, which makes it difficult to excite the SAW. In addition, the thickness of the intermediate layer 120 may be obtained by observing a cut surface of the SAW device with a film thickness measurement device, for example, a scanning electron microscope (SEM) or the like. The intermediate layer 120 has an insulation level such that its resistivity is preferably not less than about 104 Ω·cm. This is because if the resistivity of the intermediate layer 120 is lower than 104 Ω·cm, the conductivity becomes high, which may cause power loss.

The piezoelectric layer 130 is a layer formed on an upper surface of the intermediate layer 120. The piezoelectric layer 130 may be made of $LiNbO_3$ (LN), $LiTaO_3$ (LT), or the like, and may be single crystalline. In addition, the thickness of the piezoelectric layer 130 is not particularly limited, and may be appropriately selected according to application of the SAW device 100.

Also, in order to improve the piezoelectric properties of the SAW device 100, the piezoelectric layer 130 may be made of $LiNbO_3$. The piezoelectric layer 130 may be formed by a bonding process. The bonding methods include atomic diffusion bonding (ADB) and surface activation bonding (SAB) methods, and a method of forming the thickness of the piezoelectric layer includes a grinding method and an ion cut method.

The IDT electrode 140 is an electrode formed on the upper surface of the piezoelectric layer 130 to generate SAWs. The IDT electrode 140 may be a single comb-shaped electrode or a double comb-shaped electrode. The material for forming the IDT electrode 140 is not particularly limited, but the IDT electrode 140 may be selected from Al, Al—Cu, Al—Si—Cu, and the like in consideration of processability and cost.

The thickness of the IDT electrode 140 may be set to any desired range so long as the IDT electrode 140 can develop the function of exciting SAWs, but it is preferably in the range of about 10 to 500 nm. This is because if the thickness of the IDT electrode 140 is less than 10 nm, the resistivity becomes high, resulting in an increased loss, and if the thickness of the IDT electrode 140 exceeds 500 nm, the mass effect of the electrodes upon producing SAW reflection is noticeable and the desired SAW characteristics would be impeded.

In addition, the IDT electrode 140 may be disposed such that it is buried in the surface of the piezoelectric layer 130. More specifically, by way of example, recessed grooves are formed in the surface of the piezoelectric layer 130, and a conductive material, such as Al, which forms the IDT electrode 140, is completely or partially buried in the recessed grooves. By burying the whole or part of the IDT electrode 140 in the underlying layer, the height of the IDT electrode 140 can be made almost equal to that of the surface in which the IDT electrode 140 is to be formed. Consequently, it is possible to reduce the effect caused by the thickness of the IDT electrode 140 upon SAW reflection.

Figure 5:
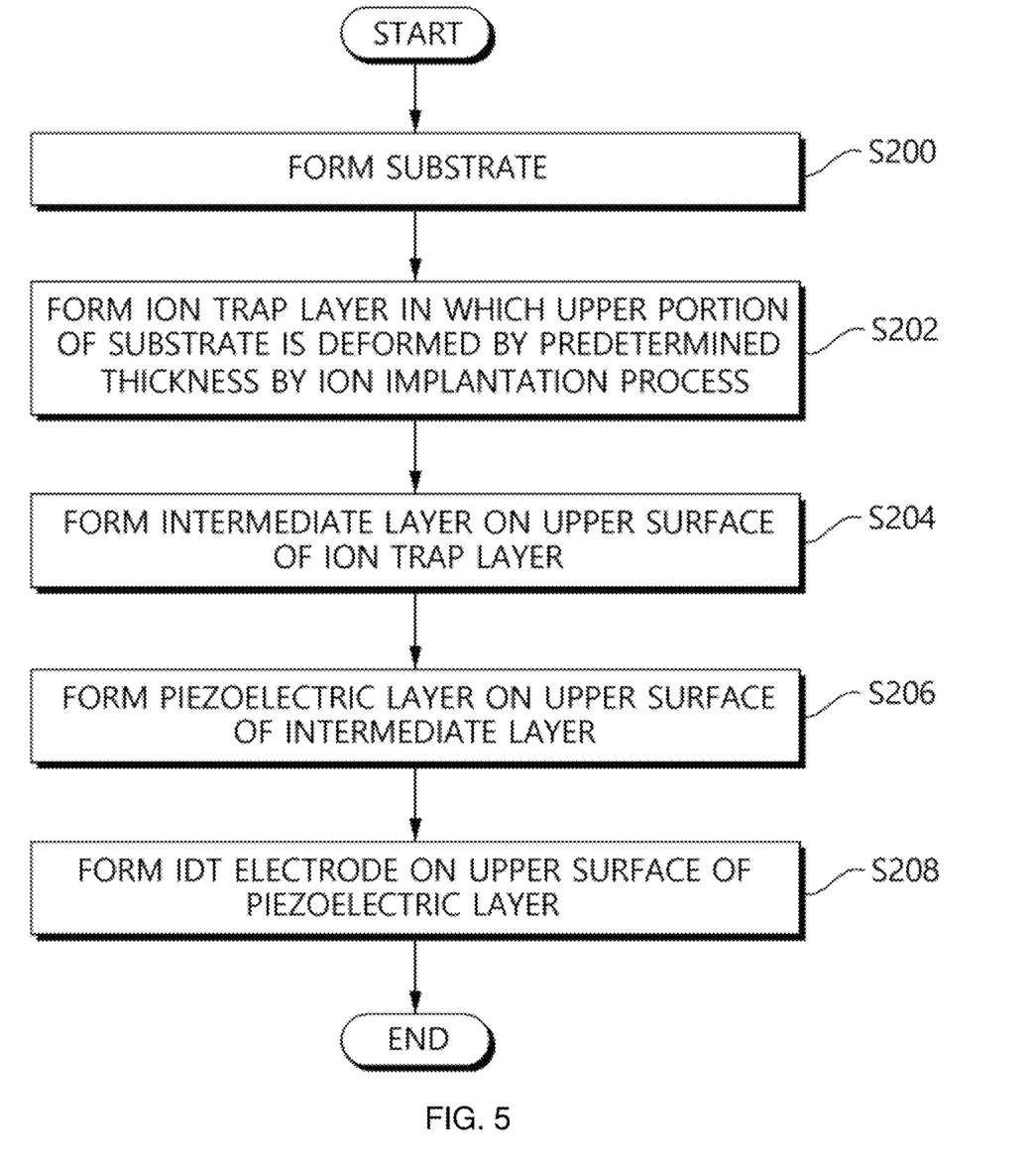
FIG. 5 is a flowchart illustrating an embodiment for describing a method of manufacturing a SAW device according to the present invention.
Figure 6:
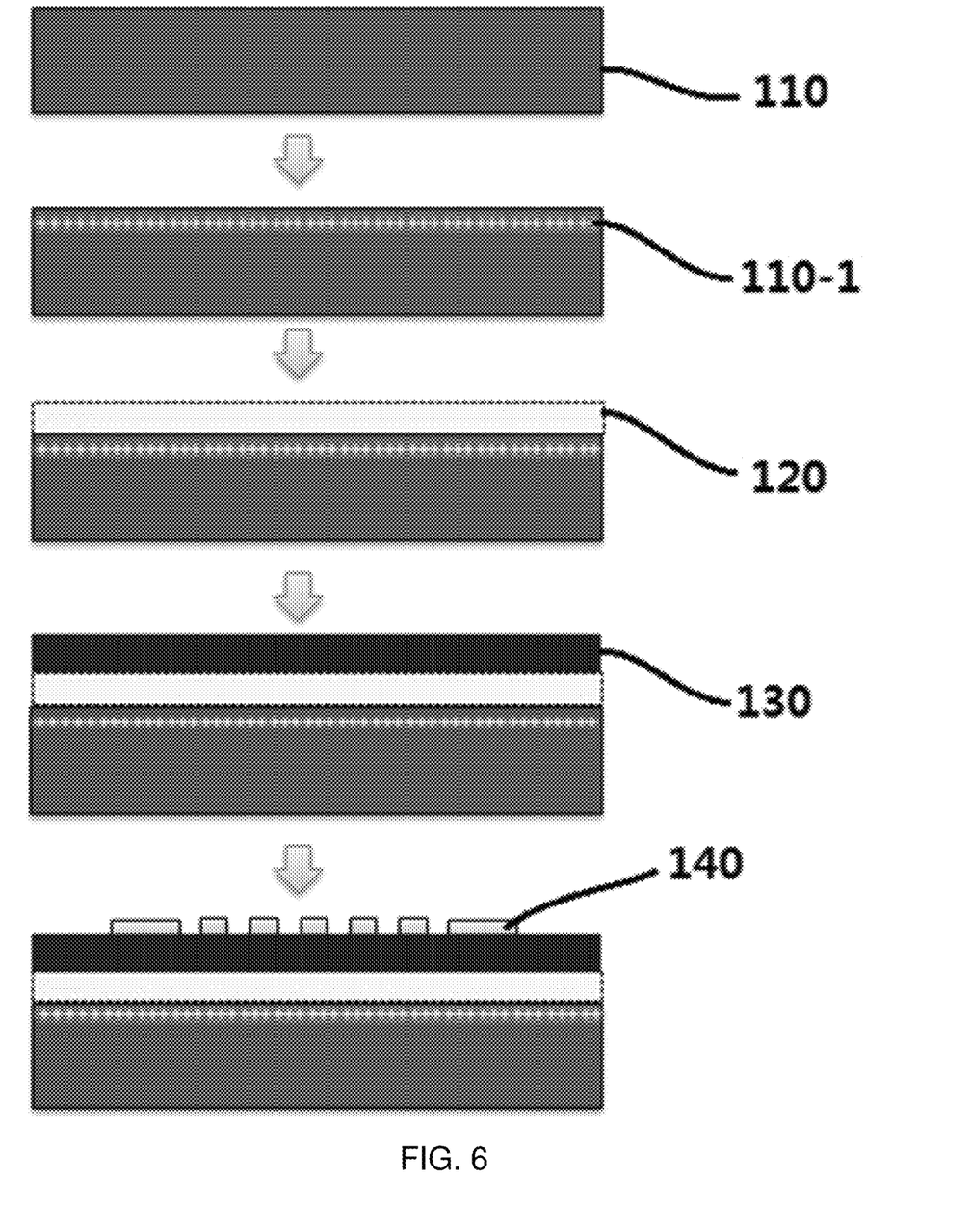
FIG. 6 is a reference diagram illustrating a stacked structure according to a manufacturing process of the SAW device of FIG. 5.

FIG. 5 is a flowchart illustrating an embodiment for describing a method of manufacturing a SAW device according to the present invention, and FIG. 6 is a reference diagram illustrating a stacked structure according to a manufacturing process of the SAW device of FIG. 5.

First, a substrate is formed (operation S200). Various methods may be used to form the substrate, and specifically, the methods may include a chemical vapor deposition (CVD) method, a microwave plasma CVD method, a physical vapor deposition (PVD) method, a sputtering method, an ion planting method, a plasma jet method, a flame method, a hot filament method, and so on.

After operation S200, an ion implantation process is performed on the upper portion of the substrate to form an ion trap layer in which the upper portion of the substrate is deformed by a predetermined thickness (operation S202). The ion trap layer corresponds to a layer in which the substrate 110 made of a silicon (Si) material, sapphire material, or diamond material is amorphized.

Examples of types of ions used for ion implantation may include argon ions, silicon ions, neon ions, or nitrogen ions. For example, an energy of 350 keV may be applied for argon ions, an energy of 270 KeV may be applied for silicon ions, an energy of 170 KeV may be applied for neon ions, and an energy of 150 KeV may be applied for nitrogen ions. The substrate made of the silicon material, sapphire material, or diamond material is amorphized, so that the leakage of the SAW energy through the substrate can be prevented. In order to function as a trap layer for preventing energy leakage, the ion trap layer formed on the substrate may have a thickness of from 0.4 μm to 0.6 μm.

In the case of a process of forming an ion trap layer by ion implantation, the energy (keV) applied and the amount of implanted ions (ion/sqcm) may be different for each ion type as shown in Table 1 below.

TABLE 1

| Specie | Energy (keV) | Dose (ion/sqcm) | Cost | Process |
|---|---|---|---|---|
| Nitrogen | 150 | 6.0 E15 | Low cost | High risk (Large modeling difference) |
| Neon | 170 | 2.4 E15 | Intermediate cost | Effective |
| Silicon | 270 | 1.6 E15 | High cost | Low risk |
| Argon | 350 | 1.2 E15 | Low cost | High risk |

Referring to Table 1, in the case of nitrogen ions with small particle size, relatively small energy (e.g., 150 keV) is applied, and as the particle size of the ions increases, higher energy is applied. Thus, in the case of argon ions, an energy of 350 keV is applied. On the other hand, reviewing the amount of ions to be injected from Table 1, in the case of nitrogen ions with small particle size, a large amount of ions (e.g., 6.0 E15 ion/sqcm) is implanted, and as the particle size of ions increases, a smaller amount of ions is implanted. Thus, in the case of argon ions, 6.0 E15 ion/sqcm is implanted.

Accordingly, reviewing the efficiency, the nitrogen ions are advantageous in terms of cost since the applied energy is small, but there is a relatively high possibility that variations in the effect as an ion trap layer may occur. On the other hand, in the case of silicon ions, since the applied energy is large, the silicon ions are disadvantageous compared to nitrogen ions or neon ions in terms of cost, but they are advantageous in that there is little possibility that variations in the effect as an ion trap layer occur.

Meanwhile, in the ion implantation process according to the present invention, the ion trap layer may be formed by one ion implantation process, but the ion trap layer may be formed by at least two ion implantation processes.

Table 2 shows the comparison of ion implantation efficiency of each ion according to two ion implantation processes.

TABLE 2

| Specie | 1st Energy (keV) | 1st Dose (ion/sqcm) | 2nd Energy (keV) | 2nd Dose (ion/sqcm) |
|---|---|---|---|---|
| Nitrogen | 150 | 2.5 E15 | 50 | 1.0 E15 |
| Neon | 170 | 1.5 E15 | 85 | 4.5 E14 |
| Silicon | 270 | 8.5 E14 | 135 | 4.0 E14 |
| Argon | 350 | 7.0 E14 | 175 | 3.0 E14 |

Referring to Table 2, in the case of nitrogen ions, an ion amount of 2.5 E15 ion/sqcm is implanted into the substrate 110 with an energy of 150 keV in a primary implantation process and an ion amount of 1.0 E15 ion/sqcm is implanted into the substrate 110 with an energy of 50 keV in a secondary implantation process. In the case where ions are implanted twice, the total amount of ions to be implanted is 2.5 E15+1.0 E15 ion/sqcm, which is smaller than the ion amount of 6.0 E15 ion/sqcm of the single ion implantation process in Table 1, and the equivalent ion trap layer can be formed even with such a small amount of ions. Therefore, when ions are implanted by performing the ion implantation process two or more times, it is advantageous in terms of energy consumption rate.

Meanwhile, in the above description, the ion implantation process is described as being performed two or more times by varying the energy or the amount of ions, but the ion implantation process may be performed two or more times with the same energy or the same amount of ions. In other words, the ion trap layer may be formed through at least two or more ion implantation processes by varying at least one of factors including energy, the amount of ions, and time.

Similarly to the case of nitrogen ions, an ion trap layer may be formed by performing two or more ion implantation processes for neon ions, silicon ions, and argon ions. In particular, in the case of silicon ions, the total amount of ions implanted by the two implantation processes is 8.5 E14+4.0 E14 ion/sqcm, whereas in Table 1, the amount of ions implanted by the single implantation process is 1.6 E15 ion/sqcm. Thus, the two ion implantation processes are quite efficient in terms of energy consumption. Therefore, it is preferable to form the ion trap layer by the implantation of silicon ions by performing the ion implantation process two or more time, rather than only once.

After operation S202, an intermediate layer is formed on an upper surface of the ion trap layer (operation S204). The intermediate layer has the function of controlling the crystalline characteristics of the piezoelectric layer 130 positioned thereon, and may be made of $SiO_2$ material, AlN material, or the like. The thickness of the intermediate layer may be appropriately selected according to the type, size, purpose of use, and the like of the underlying substrate 110, and may be in a range between 5 and 500 nm. The reason is that if the intermediate layer is thinner than the lower limit of the above range, the function of controlling the crystalline characteristics of the piezoelectric layer tends to be insufficient, and if the intermediate layer is thicker than the upper limit of the above range, the electromechanical coupling coefficient becomes small, which makes it difficult to excite the SAW. The intermediate layer may be formed by various vapor deposition methods, such as a CVD method, a PVD method, a sputtering method, an ion plating method, and the like.

After operation S204, a piezoelectric layer is formed on an upper surface of the intermediate layer (operation S206). The piezoelectric layer may be made of $LiNbO_3$(LN), $LiTaO_3$(LT), or the like, and may be single crystalline. In addition, the thickness of the piezoelectric layer is not particularly limited, and may be appropriately selected according to application of the SAW device. The piezoelectric layer may be formed by a bonding process. The bonding methods include ADB and SAB methods, and a method of forming the thickness of the piezoelectric layer includes a grinding method and an ion cut method.

After operation S206, an IDT electrode for generating a SAW is formed on the upper surface of the piezoelectric layer (operation S208).

The IDT electrode may be a single comb-shaped electrode or a double comb-shaped electrode. The IDT electrode may be made of Al, Al—Cu, Al—Si—Cu, or the like. The thickness of the IDT electrode may be set to any desired range so long as the IDT electrode 140 can develop the function of exciting SAWs, but it is preferably in the range of about 10 to 500 nm. Recessed grooves are formed in the surface of the piezoelectric layer 130, and a conductive material, such as Al, which forms the IDT electrode, is completely or partially buried in the recessed grooves.

According to the present invention, an intermediate layer is formed on an upper surface of a substrate, a piezoelectric layer is formed on an upper surface of the intermediate layer, an IDT electrode is formed on an upper surface of the piezoelectric layer, and an ion trap layer is formed by an ion implantation in an upper portion of the substrate so that the loss of SAW energy in the direction of the substrate is prevented by the ion trap layer. Accordingly, by suppressing the loss of the SAW energy in the direction of the substrate, it is possible to prevent reduction of quality factor.

In addition, the ion trap layer is formed on the substrate by performing the ion implantation process two or more times, it is possible to minimize excessive energy consumption for the formation of the ion trap layer. In addition, it is possible to prevent the energy of the existing SAW from dissipating through the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A surface acoustic wave (SAW) device comprising:
a substrate;
an intermediate layer formed on an upper surface of the substrate;
a piezoelectric layer formed on an upper surface of the intermediate layer; and
an inter-digital transducer (IDT) electrode formed on an upper surface of the piezoelectric layer to generate a SAW,
wherein an upper portion of the substrate is deformed by a predetermined thickness by ion implantation to form an ion trap layer and the intermediate layer is formed on an upper surface of the ion trap layer,
wherein the ion trap layer is amorphized through the ion implantation, whereby the ion trap layer is configured to prevent leakage of SAW energy toward the substrate,
wherein the ion implantation is a process by which argon ions are implanted into the substrate by being accelerated with an electric field,
wherein the ion implantation includes a first ion implantation by which the argon ions are implanted into the substrate at an energy of 350 keV and a dose of 7.0 E14 ion/sqcm and a second ion implantation by which the argon ions are implanted into the substrate at an energy of 175 keV and a dose of 3.0 E14 ion/sqcm,
wherein the intermediate layer is made of any one of $SiO_2$ material and AlN material, and
wherein a thickness of the intermediate layer is in a range between 5 and 500 nm.

2. A surface acoustic wave (SAW) device comprising:
a substrate;
an intermediate layer formed on an upper surface of the substrate;
a piezoelectric layer formed on an upper surface of the intermediate layer; and
an inter-digital transducer (IDT) electrode formed on an upper surface of the piezoelectric layer to generate a SAW,
wherein an upper portion of the substrate is deformed by a predetermined thickness by ion implantation to form an ion trap layer and the intermediate layer is formed on an upper surface of the ion trap layer,
wherein the ion trap layer is amorphized through the ion implantation, whereby the ion trap layer is configured to prevent leakage of SAW energy toward the substrate, wherein the ion implantation is a process by which silicon ions are implanted into the substrate by being accelerated with an electric field, wherein the ion implantation includes a first ion implantation by which the silicon ions are implanted into the substrate at an energy of 270 keV and a dose of 8.5 E14 ion/sqcm and a second ion implantation by which the silicon ions are implanted into the substrate at an energy of 135 keV and a dose of 4.0 E14 ion/sqcm, wherein the intermediate layer is made of any one of $SiO_2$ material and AlN material, and wherein a thickness of the intermediate layer is in a range between 5 and 500 nm.

3. A surface acoustic wave (SAW) device comprising:
a substrate;
an intermediate layer formed on an upper surface of the substrate;
a piezoelectric layer formed on an upper surface of the intermediate layer; and
an inter-digital transducer (IDT) electrode formed on an upper surface of the piezoelectric layer to generate a SAW,
wherein an upper portion of the substrate is deformed by a predetermined thickness by ion implantation to form an ion trap layer and the intermediate layer is formed on an upper surface of the ion trap layer,
wherein the ion trap layer is amorphized through the ion implantation, whereby the ion trap layer is configured to prevent leakage of SAW energy toward the substrate,
wherein the ion implantation is a process by which neon ions are implanted into the substrate by being accelerated with an electric field,
wherein the ion implantation includes a first ion implantation by which the neon ions are implanted into the substrate at an energy of 170 keV and a dose of 1.5 E15 ion/sqcm and a second ion implantation by which the neon ions are implanted into the substrate at an energy of 85 keV and a dose of 4.5 E14 ion/sqcm,
wherein the intermediate layer is made of any one of $SiO_2$ material and AlN material, and
wherein a thickness of the intermediate layer is in a range between 5 and 500 nm.

4. A surface acoustic wave (SAW) device comprising:
a substrate;
an intermediate layer formed on an upper surface of the substrate;
a piezoelectric layer formed on an upper surface of the intermediate layer; and
an inter-digital transducer (IDT) electrode formed on an upper surface of the piezoelectric layer to generate a SAW,
wherein an upper portion of the substrate is deformed by a predetermined thickness by ion implantation to form an ion trap layer and the intermediate layer is formed on an upper surface of the ion trap layer,
wherein the ion trap layer is amorphized through the ion implantation, whereby the ion trap layer is configured to prevent leakage of SAW energy toward the substrate,
wherein the ion implantation is a process by which nitrogen ions are implanted into the substrate by being accelerated with an electric field,
wherein the ion implantation includes a first ion implantation by which the nitrogen ions are implanted into the substrate at an energy of 150 keV and a dose of 2.5 E15 ion/sqcm and a second ion implantation by which the nitrogen ions are implanted into the substrate at an energy of 50 keV and a dose of 1.0 E15 ion/sqcm,
wherein the intermediate layer is made of any one of $SiO_2$ material and AlN material, and
wherein a thickness of the intermediate layer is in a range between 5 and 500 nm.

5. The SAW device of claim 4, wherein the predetermined thickness is 0.05 μm to 1.0 μm.

6. The SAW device of claim 3, wherein the predetermined thickness is 0.05 μm to 1.0 μm.

7. The SAW device of claim 2, wherein the predetermined thickness is 0.05 μm to 1.0 μm.

8. The SAW device of claim 1, wherein the predetermined thickness is 0.05 μm to 1.0 μm.

* * * * *